United States Patent
Yang et al.

(10) Patent No.: US 7,667,169 B2
(45) Date of Patent: Feb. 23, 2010

(54) IMAGE SENSOR WITH SIMULTANEOUS AUTO-FOCUS AND IMAGE PREVIEW

(75) Inventors: Hongli Yang, Saratoga, CA (US); Hongjun Li, San Jose, CA (US); Xinping He, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 12/125,829

(22) Filed: May 22, 2008

(65) Prior Publication Data

US 2009/0289169 A1 Nov. 26, 2009

(51) Int. Cl.
*G02B 7/04* (2006.01)
*G02B 27/40* (2006.01)
*G02B 27/64* (2006.01)

(52) U.S. Cl. ............. 250/201.2; 250/208.1; 250/214 R; 348/208.12; 348/294; 348/345

(58) Field of Classification Search ............... 250/201.2, 250/201.1, 201.3, 214.1, 214 R, 208.1, 216, 250/214 AG; 348/278–280, 272, 281, 294, 348/297–298, 302, 208.12, 326, 345

See application file for complete search history.

(56) References Cited

U.S. PATENT DOCUMENTS

| 2003/0099470 A1* | 5/2003 | Tseng | ......................... 396/61 |
| 2006/0038904 A1* | 2/2006 | Kudoh | ........................ 348/308 |
| 2007/0188630 A1* | 8/2007 | Suzuki | .................... 348/240.2 |

OTHER PUBLICATIONS

Chu, Failop, "Improving CMOS image sensor performance with combined pixels: How Kodak's PIXELUX technology boosts sensitivity, S/N," Kodak Image Sensor Solutions Group, Nov. 21, 2005, pp. 1-9.

* cited by examiner

*Primary Examiner*—Thanh X Luu
*Assistant Examiner*—Francis M Legasse, Jr.
(74) *Attorney, Agent, or Firm*—Blakely Sokoloff Taylor & Zafman, LLP

(57) ABSTRACT

Embodiments of the present invention are directed to a plurality of light sensor cells disposed in a substrate in a shared pixel arrangement. Common readout circuitry is used to simultaneously read out image information from a group of light sensor cells. The image information from the group of light sensor cells is added together simultaneously and coupled to auto-focus circuitry and/or preview circuitry to provide for better lens adjustments and preview display.

21 Claims, 3 Drawing Sheets

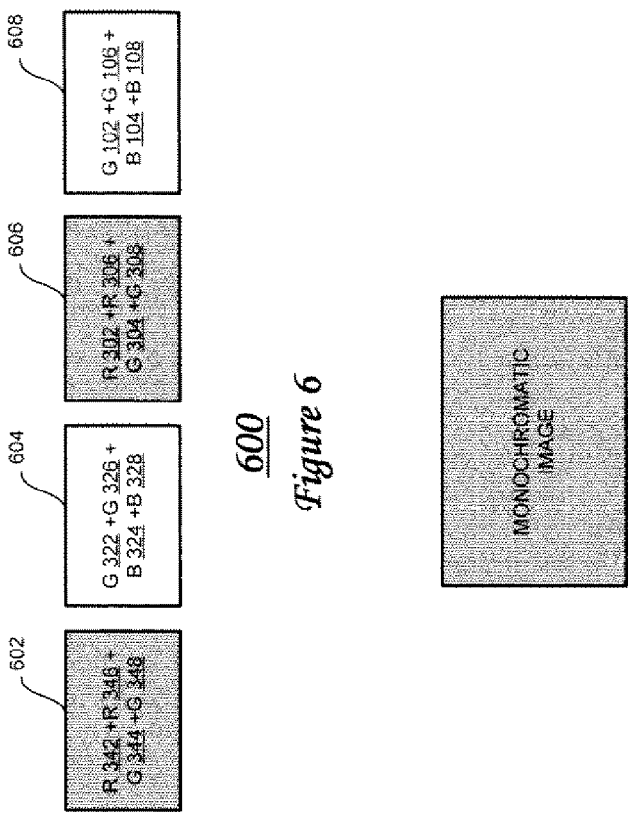
600
*Figure 6*
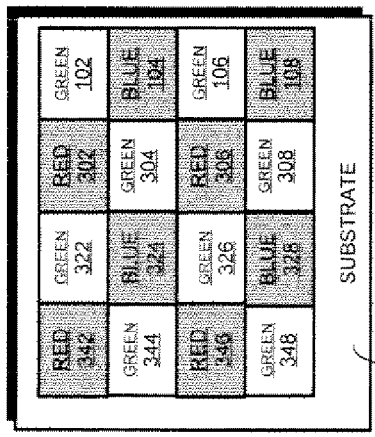
100
*Figure 3*
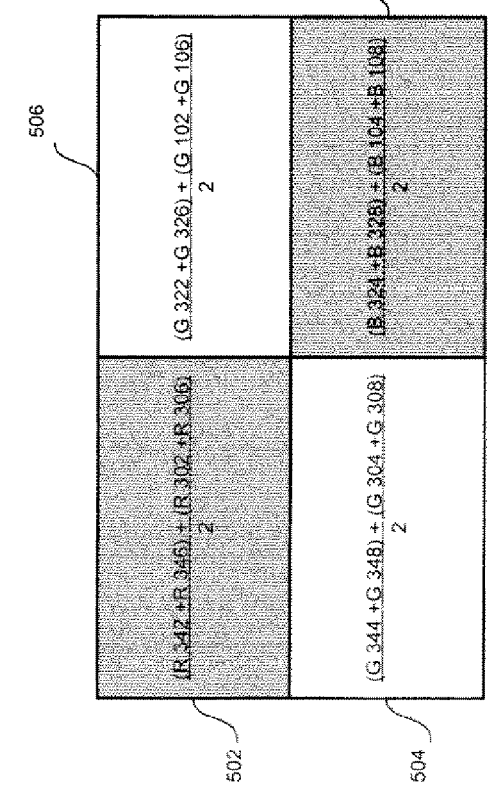

IMAGE SENSOR WITH SIMULTANEOUS AUTO-FOCUS AND IMAGE PREVIEW

BACKGROUND

1. Field

Embodiments of the present invention relate to image sensors and, in particular, to auto-focus in image sensors.

2. Discussion of Related Art

In general, digital imaging devices may be one of two types: automatic focus (auto-focus) and fixed-focus. The fixed-focus devices usually are incapable of affecting lens position or changing the aperture and, instead, rely on a large depth of field where the object appears to be in focus. Although acceptable in many cases, the images captured by fixed-focus devices are not as sharp as those captured by auto-focus devices.

There are different methods and associated apparatus to automatically focus a digital imaging device. In one method the lens is moved in a direction that increases the intensity of the light on light sensing elements and is stopped after the maximum intensity is achieved. Another automatic focusing technique relies upon finite impulse response (FIR) filters to determine the edge features and their sharpness. Such a technique is less effective in case of images with widely varying intensity/color values, since averaging distorts results.

There are many conventional auto-focusing techniques for image sensors, including measuring the distance from the object of interest and mapping the distance to some measurable quantity that drives the optical system to arrive at the correct focus. This method of auto-focusing is performed in parallel to the main imaging path, which is ideal for film-based cameras.

As digital imaging devices become dominant in the market, auto-focusing techniques rely mainly on the data obtained from the main imaging data path. The basic assumption is that the best focus condition is achieved when the image contains the maximum amount of high frequency information, measured by applying digital filtering to a portion of the digitized image data. The computed energy of the filtered spectrum is used as a measure of frequency content.

Conventional image sensors work well, but can be improved upon. This is true for auto-focus capabilities as well as other capabilities. For example, image sensors that provide preview capabilities where an image is scaled down to the format of small screens so that a user can view the image prior to taking a picture also could be improved upon.

BRIEF DESCRIPTION OF THE DRAWINGS

In the drawings, like reference numbers generally indicate identical, functionally similar, and/or structurally equivalent elements. The drawing in which an element first appears is indicated by the leftmost digit(s) in the reference number, in which:

FIG. 3 is a block diagram of a portion of the image sensor depicted in FIG. 1 illustrating for purposes of binning according to an embodiment of the present invention;

FIG. 4 illustrates same-color vertical binning according to an embodiment of the present invention;

FIG. 5 illustrates digitally averaging the vertically binned light sensor cells depicted in FIG. 4 according to an embodiment of the present invention;

FIG. 6 illustrates all-color vertical binning according to an embodiment of the present invention; and FIG. 7 illustrates a monochromatic image resulting from all-color binning according to an embodiment of the present invention.

DETAILED DESCRIPTION OF EMBODIMENTS

In the below description, numerous specific details, such as, for example, particular processes, materials, devices, and so forth, are presented to provide a thorough understanding of embodiments of the invention. One skilled in the relevant art will recognize, however, that the embodiments of the present invention may be practiced without one or more of the specific details, or with other methods, components, etc. In other instances, structures or operations are not shown or described in detail to avoid obscuring the understanding of this description.

Reference throughout this specification to "one embodiment" or "an embodiment" means that a particular feature, structure, process, block, or characteristic described in connection with an embodiment is included in at least one embodiment of the present invention. Thus, the appearance of the phrases "in one embodiment" or "in an embodiment" in various places throughout this specification does not necessarily mean that the phrases all refer to the same embodiment. The particular features, structures, or characteristics may be combined in any suitable manner in one or more embodiments.

According to embodiments of the present invention, an image sensor includes an array of light sensor cells disposed in a substrate. An individual light sensor cell includes a photosensitive element and a floating diffusion region, which are coupled together when an associated transfer transistor is turned on. For some embodiments, a group of light sensor cells are read out simultaneously using common readout circuitry. The image information from the group of light sensor cells is added together. This is sometimes referred to as shared pixel readout. The image information is coupled to auto-focus circuitry. For other embodiments, a group of light sensor cells are read out simultaneously using common readout circuitry, the image information from the group of light sensor cells is added together and coupled to preview circuitry. One advantage of using shared pixel readout as an input to auto-focus circuitry and/or preview circuitry is that the overall sensitivity of the auto-focus circuitry and/or preview circuitry is improved. Other features and advantages of the present invention will be apparent from the accompanying drawings and from the detailed description that follows.

Figure 1:
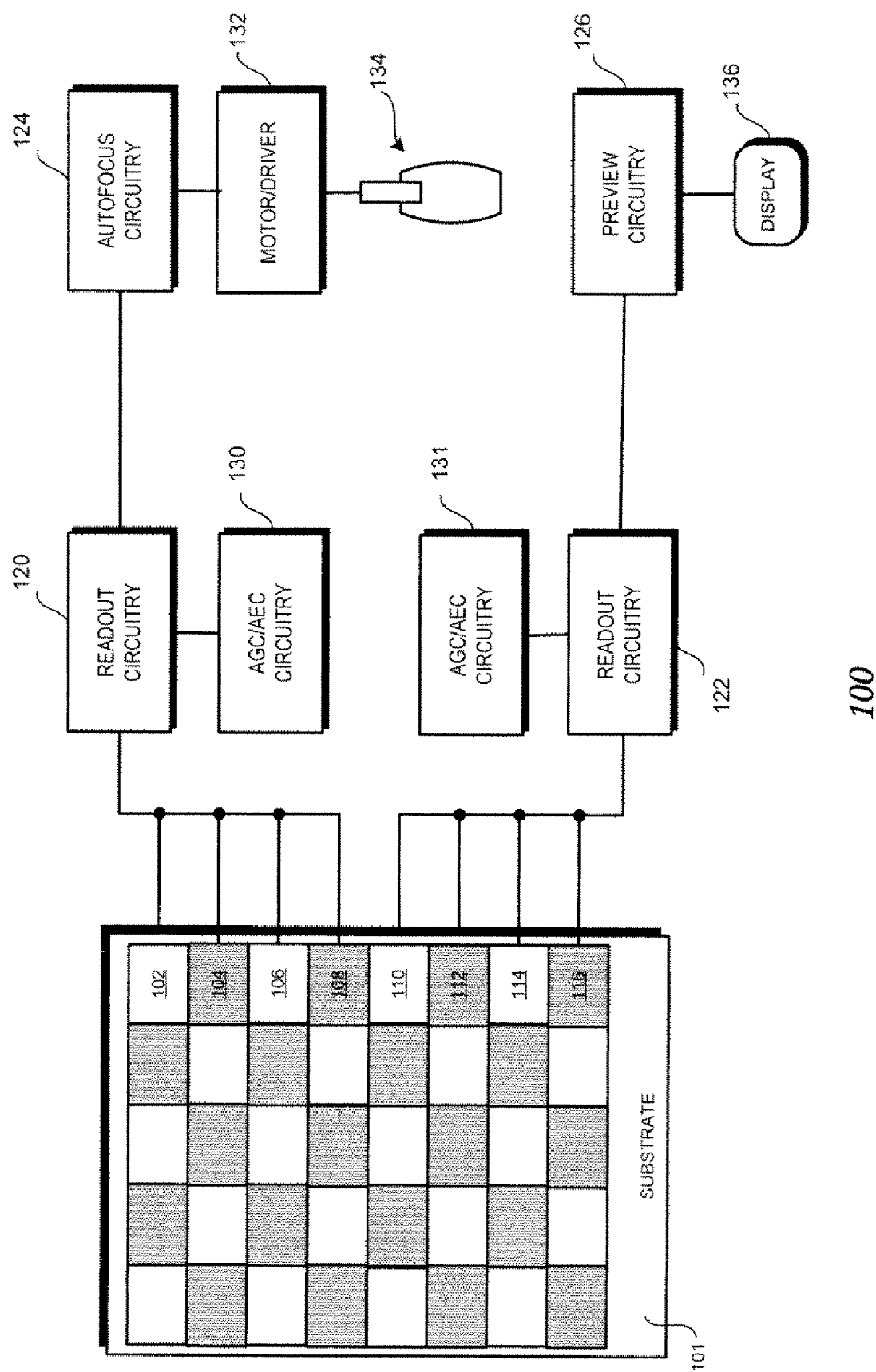
FIG. 1 is a block diagram of an image sensor according to an embodiment of the present invention.

FIG. 1 is a block diagram of an image sensor 100 according to an embodiment of the present invention. Generally, an image sensor includes several light sensor cells arranged in an array of two dimensional rows and columns in a substrate. In the illustrated embodiment, the image sensor 100 includes a 5×8 array of light sensor cells disposed on a substrate 101, such as a semiconductor substrate. Of course, the image sensor 100 can have many more or fewer light sensor cells than those depicted. The substrate may be a complementary metal on semiconductor (CMOS) substrate. The semiconductor may be silicon.

For purposes of explanation, only light sensor cells 102, 104, 106, 108, 110, 112, 114, and 116 disposed on the substrate 101 are described. In the illustrated embodiment, light sensor cells 102, 104, 106, and 108 are coupled to readout circuitry 120 and light sensor cells 110, 112, 114, and 116 are coupled to readout circuitry 122. Readout circuitry 120 is coupled to auto-focus circuitry 124 and readout circuitry 122 is coupled to preview circuitry. In the illustrated embodiment, the auto-focus circuitry 124 is coupled to a lens motor/driver 132, which is coupled to a lens assembly 134. The preview circuitry 126 is coupled to a display 136. The readout circuitry 120 is coupled to automatic gain control (AGC) circuitry and automatic exposure control (AEC) circuitry 130. The readout circuitry 122 is coupled to automatic gain control (AGC) circuitry and automatic exposure control (AEC) circuitry 131.

For some embodiments, the light sensor cells 102, 104, 106, and 108 accumulate image information in response to being exposed to light. The readout circuitry 120 reads out the image information accumulated in the light sensor cells 102, 104, 106, and 108 simultaneously. The readout circuitry 120 adds together the image information from each of the light sensor cells 102, 104, 106, and 108.

Adding together the image information in each of the light sensor cells 102, 104, 106, and 108 increases the fill factor of the image sensor 100. The fill factor is the portion of the image sensor 100 that is sensitive to light. As the fill factor increases, more light will be captured. As a result, the signal to noise ratio (SNR) for the image sensor 100 may increase. Also, the ability of the image sensor 100 to convert light into an electrical signal, also known as quantum efficiency, may be increased.

For some embodiments, the light sensor cells 110, 112, 114, and 116 accumulate image information in response to being exposed to light. The readout circuitry 122 reads out the image information accumulated in the light sensor cells 110, 112, 114, and 116 simultaneously. The readout circuitry 122 adds together the image information from each of the light sensor cells 110, 112, 114, and 116.

As is the case with the light sensor cells 102, 104, 106, and 108, adding together the image information in each of the light sensor cells 110, 112, 114, and 116 increases the fill factor of the image sensor 100. The fill factor is the portion of the image sensor 100 that is sensitive to light. As the fill factor increases, more light will be captured. As a result, the signal to noise ratio (SNR) for the image sensor 100 may increase. Also, the ability of the image sensor 100 to convert light into an electrical signal, also known as quantum efficiency, may be increased.

The automatic exposure control portion of the AGC/AEC circuitry 130 may be used to prevent the image sensor 100 from saturation, to prevent overexposure and/or underexposure conditions, to compensate for changing reflection characteristics of the scene, etc. The automatic gain control portion of the AGC/AEC circuitry 131 also may be used to prevent the image sensor 100 from saturation.

According to embodiments of the present invention, there are two different AGC/AEC circuitries so that the gain control and exposure control for the signals to the auto-focus circuitry 124 is separate from the gain control and exposure control for the signals to the preview circuitry 126. For some embodiments, the use of the shared pixel design illustrated in FIG. 1 may support charge binning of multiple light sensor cells, leading to a significant improvement in sensitivity. Light sensor cells used for auto-focus may be different than light sensor cells used for preview and/or other purposes. The two different AGC/AEC circuitries 130 and 131 allow for control of the high sensitivity light sensor cells used for auto-focus separately from the light sensor cells that are not used for auto-focus. At normal readout (full resolution), the image sensor 100 can switch to one AGC/AEC, and in sub-sampling mode, the image sensor 100 can use AGC/AEC circuitry 131 to readout a normal sub-sampling image, and use the AGC/AEC circuitry 130 for the autofocus to address a different sensitivity.

For some embodiments, the substrate 101 may be any suitable substrate. One suitable substrate is a semiconductor substrate. The material may be silicon.

For some embodiments, the photosensitive elements 102, 104, 106, and 108 may be any suitable devices that convert light into an electric signal. For example, photosensitive elements 102, 104, 106, and 108 may be a photodiode, a pinned photodiode, a photogate, or other solid state device. Other suitable photosensitive elements may be utilized as well.

Figure 2:
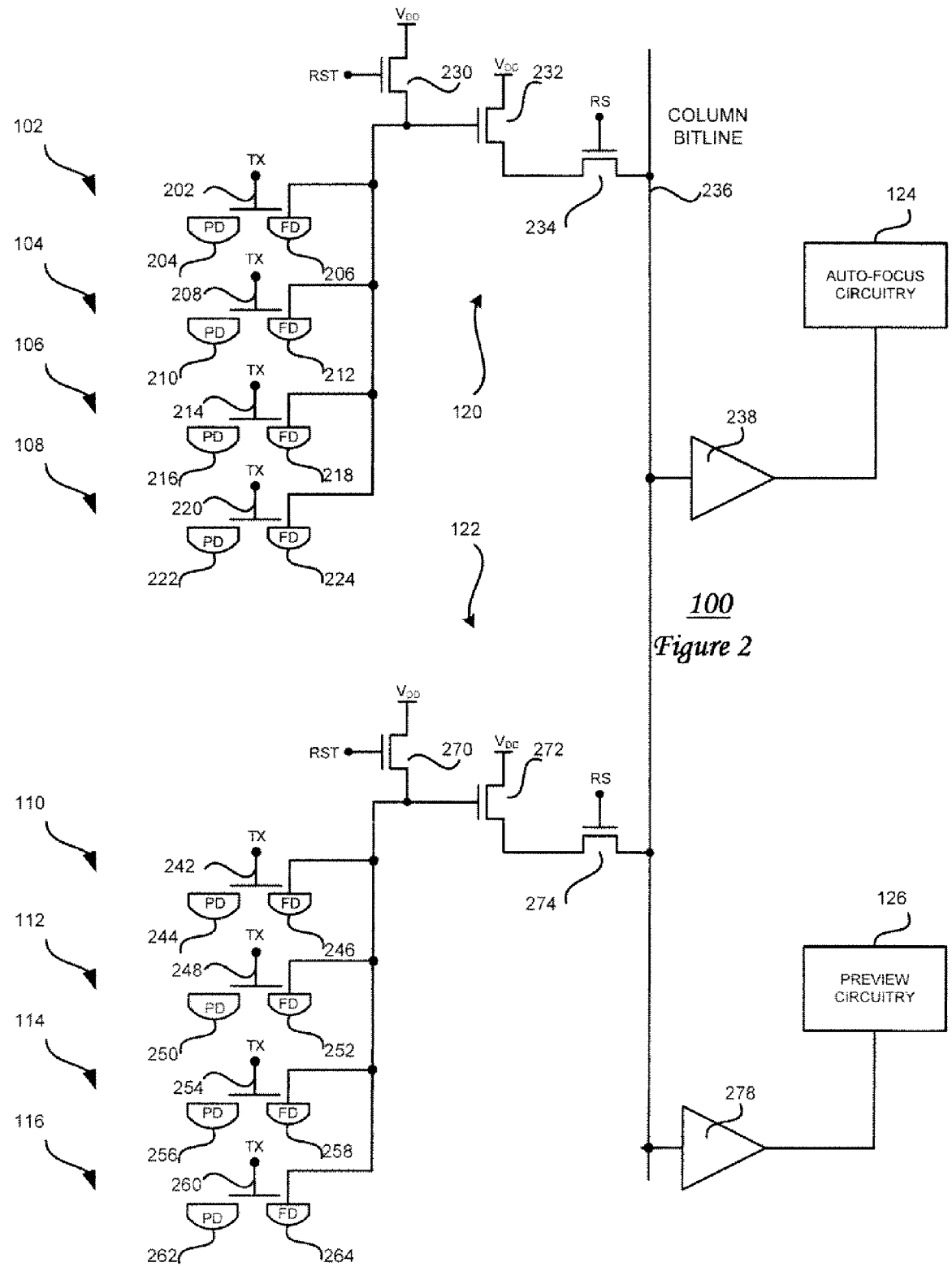
FIG. 2 is a schematic diagram of the image sensor depicted in FIG. 1 according to an embodiment of the present invention.

FIG. 2 is a schematic diagram of the image sensor 100 in more detail according to an embodiment of the present invention. In the illustrated embodiment, each light sensor cell includes a transfer transistor, a photosensitive element, and a capacitive floating diffusion region. For example, the light sensor cell 102 includes a transfer transistor 202, a photosensitive element 204 (illustrated as photodetector (PD) 204), and a floating diffusion region 206. The light sensor cell 104 includes a transfer transistor 208, a photosensitive element 210, and a floating diffusion region 212. The light sensor cell 106 includes a transfer transistor 214, a photosensitive element 216, and a floating diffusion region 218. The light sensor cell 108 includes a transfer transistor 220, a photosensitive element 222, and a floating diffusion region 224. A bias voltage may be coupled to each of the transfer transistors.

Each floating diffusion region 206, 212, 218, and 224 is coupled to a reset transistor 230, which is part of the common readout circuitry 120. The common readout circuitry 120 also includes a source follower 232 whose gate is coupled to the source of the reset transistor 230. The drains of the reset transistor 230 and the source follower 232 may be coupled to a reference voltage such as $V_{DD}$. The common readout circuitry 120 also includes a row select transistor 234 whose source is coupled to the source of the source follower 232 and whose drain is coupled to a column bitline 236. In addition to the column bitline 236, the drain of the row select transistor 234 also is coupled to an input of a sense amplifier 238. An output of the sense amplifier 238 is coupled to the auto-focus circuitry 124.

As illustrated, the image sensor 100 implements a four transistor (4T) cell architecture in that light sensor cell 102, reset transistor 230, source follower 232, and row select transistor 234 are four transistors. The light sensor cells 104, 106, and 108 also share the reset transistor 230, source follower 232, and row select transistor 234. However, the each light sensor cell 102, 104, 106, and 108 may be a 5T architecture, 6T architecture, 7T architecture, etc.

Embodiments of the light sensor cells 102, 104, 106, and 108 may operate as follows. Prior to integration of light into the light sensor cells 102, 104, 106, and 108 (also referred to as an exposure or accumulation period), the light sensor cells 102, 104, 106, and 108 may be reset by turning on the transfer transistors 202, 208, 214, and 220, respectively, simultaneously with the reset transistor 230. A RST signal may be used to turn on the reset transistor 230. When the transfer transistors 202, 208, 214, and 220 and the reset transistor 230 are turned on the photosensitive elements 204, 210, 216, and 222 and floating diffusion regions 206, 212, 218, and 224 may be set to the reference voltage of $V_{DD}$.

During integration, light is incident on the photosensitive elements 204, 210, 216, and 222. The photosensitive elements 204, 210, 216, and 222 generate electrical signals in response to the incident light. The electrical signal includes image information, such as luminance levels, color, etc. The electric signal is held in the photosensitive elements 204, 210, 216, and 222. At this stage, the transfer transistors 202, 208, 214, and 220 may be turned off. In one embodiment, the bias voltage on the transfer transistors 202, 208, 214, and 220 may be a negative voltage.

After the integration period, the transfer transistors 202, 208, 214, and 220 are turned on simultaneously to read out the photosensitive elements 204, 210, 216, and 222. In one embodiment, a positive bias voltage may be applied to the transfer transistors 202, 208, 214, and 220. After the electrical signals in the photosensitive elements 204, 210, 216, and 222 have been simultaneously transferred to the floating diffusion regions 206, 212, 218, and 224, respectively, the transfer transistors 202, 208, 214, and 220 are turned off for the start of a subsequent integration period.

The reset transistor 230 may be turned on and off to reset the floating diffusion regions 206, 212, 218, and 224. After reset, the reset level may be sampled from the floating diffusion regions 206, 212, 218, and 224 and stored on the column bitline 236. The transfer transistors 202, 208, 214, and 220 may be turned on and off to allow charge on the photosensitive elements 210, 216, and 222 to transfer to the floating diffusion regions 206, 212, 218, and 224. Once charge transfer is complete, the signal levels of the photosensitive elements 210, 216, and 222 plus the reset levels of the floating diffusion regions 206, 212, 218, and 224 are measured and stored on the column bitline 236 as well.

These two stored levels may then be differenced to determine the photosensitive elements 204, 210, 216, and 222 signal levels. True Correlated Double Sampling (CDS) operation may occur, as the reset level used to determine the absolute photosensitive elements 210, 216, and 222 signal levels is now measured before the photosensitive elements 210, 216, and 222 signal levels and the same reset level is referenced throughout the measurement. By mimicking the operation of a charge-coupled device (CCD), this 4T design significantly improves on the performance of the standard 3T architecture, reducing both read noise and image lag.

For some embodiments, the electrical signals simultaneously read out from the photosensitive elements 102, 104, 106, and 108 may be used to modulate the source follower 232. The electrical signals simultaneously read out from the photosensitive elements 102, 104, 106, and 108 may be added together using the source follower 232. The row select transistor 234 may buffer the electrical signals simultaneously read out from the photosensitive elements 102, 104, 106, and 108 and the column bitline 236.

According to embodiments of the present invention, the transfer transistors 202, 208, 214, and 220 are turned on simultaneously to transfer the electrical signal in the photosensitive elements 204, 210, 216, and 222 to the floating diffusion regions 206, 212, 218, and 222 simultaneously. The sense amplifier may amplify the electrical signals simultaneously read out from the photosensitive elements 102, 104, 106, and 108 and couple them to the auto-focus circuitry 124. The auto-focus circuitry 124 may use the simultaneously read out luminance levels in the electrical signals from the photosensitive elements 102, 104, 106, and 108 to adjust the lens assembly 134 for better focusing.

In the embodiment illustrated in FIG. 2, the light sensor cell 110 includes a transfer transistor 242, a photosensitive element 244 (illustrated as photodetector (PD) 244), and a floating diffusion region 246. The light sensor cell 112 includes a transfer transistor 248, a photosensitive element 250, and a floating diffusion region 252. The light sensor cell 114 includes a transfer transistor 254, a photosensitive element 256, and a floating diffusion region 258. The light sensor cell 116 includes a transfer transistor 260, a photosensitive element 262, and a floating diffusion region 268. A bias voltage may be coupled to each of the transfer transistors 242, 248, 254, and 260.

Each floating diffusion region 246, 252, 258, and 264 is coupled to a reset transistor 270, which is part of the common readout circuitry 120. The common readout circuitry 120 also includes a source follower 272 whose gate is coupled to the source of the reset transistor 270. The drains of the reset transistor 270 and the source follower 272 may be coupled to a reference voltage such as $V_{DD}$. The common readout circuitry 120 also includes a row select transistor 274 whose source is coupled to the source of the source follower 272 and whose drain is coupled to the column bitline 236. In addition to the column bitline 236, the drain of the row select transistor 274 also is coupled to an input of a sense amplifier 278. An output of the sense amplifier 238 is coupled to the preview circuitry 126.

As is the case with the shared pixel arrangement coupled to the auto-focus circuitry 124, the image sensor 100 implements a four transistor (4T) cell architecture for the shared pixel arrangement coupled to the preview circuitry 126 in that the light sensor cell 110, reset transistor 270, source follower 272, and row select transistor 274 are four transistors. The light sensor cells 112, 114, and 116 also share the reset transistor 270, source follower 272, and row select transistor 274. However, the each light sensor cells 112, 114, and 116 may be a 5T architecture, 6T architecture, 7T architecture, etc.

Prior to integration of light into the light sensor cells 112, 114, and 116, the light sensor cells 112, 114, and 116 may be reset by turning on the transfer transistors 242, 248, 254, and 260, respectively, simultaneously with the reset transistor 270. The RST signal may be used to turn on the reset transistor 270. When the transfer transistors 242, 248, 254, and 260 and the reset transistor 270 are turned on the photosensitive elements 244, 250, 256, and 262 and floating diffusion regions 246, 252, 258, and 264 may be set to the reference voltage of $V_{DD}$.

During integration, when light is incident on the elements 244, 250, 256, and 262, photosensitive elements 244, 250, 256, and 262 generate electrical signals in response to the incident light. The electrical signal includes image information, such as luminance levels, color, etc. The electric signal is held in the photosensitive elements 244, 250, 256, and 262. The transfer transistors 242, 248, 254, and 260 may be turned off.

After the integration period, the transfer transistors 242, 248, 254, and 260 are turned on simultaneously to read out the photosensitive elements 244, 250, 256, and 262. After the electrical signals in the photosensitive elements 244, 250, 256, and 262 have been simultaneously transferred to the floating diffusion regions 246, 252, 258, and 264, respectively, the transfer transistors 242, 248, 254, and 260 are turned off for the start of a subsequent integration period.

The reset transistor 270 may be turned on and off to reset the floating diffusion regions 246, 252, 258, and 264. After reset, the reset level may be sampled from the floating diffusion regions 246, 252, 258, and 264 and stored on the column bitline 236. The transfer transistors 242, 248, 254, and 260 may be turned on and off to allow charge on the photosensitive elements 244, 250, 256, and 262 to transfer to the floating diffusion regions 246, 252, 258, and 264. Once charge transfer is complete, the signal levels of the photosensitive elements 244, 250, 256, and 262 plus the reset levels of the floating diffusion regions 246, 252, 258, and 264 are measured and stored on the column bitline 236 as well.

These two stored levels may then be differenced to determine the photosensitive elements 244, 250, 256, and 262 signal levels. True CDS operation may occur, as the reset level used to determine the absolute photosensitive elements 244, 250, 256, and 262 signal levels is now measured before the photosensitive elements 244, 250, 256, and 262 signal levels and the same reset level is referenced throughout the measurement. By mimicking the operation of a CCD, the 4T design significantly improves the performance of the standard 3T architecture, reducing both read noise and image lag.

For some embodiments, the electrical signals simultaneously read out from the photosensitive elements 244, 250, 256, and 262 may be used to modulate the source follower 272. The electrical signals simultaneously read out from the photosensitive elements 244, 250, 256, and 262 may be added together using the source follower 272. The row select transistor 274 may buffer the electrical signals simultaneously read out from the photosensitive elements 244, 250, 256, and 262 and the column bitline 276.

According to embodiments of the present invention, the transfer transistors 242, 248, 254, and 260 are turned on simultaneously to transfer the electrical signal in the photosensitive elements 244, 250, 256, and 262 to the floating diffusion regions 246, 252, 258, and 264 simultaneously. The sense amplifier may amplify the electrical signals simultaneously read out from the photosensitive elements 244, 250, 256, and 262 and couple them to the preview circuitry 126. The preview circuitry 126 may use the simultaneously read out image information in the electrical signals from the photosensitive elements 244, 250, 256, and 262 to improve the image on the display 136.

Recall from above that for some embodiments, in addition to improvements in fill-factor, the use of the shared pixel design illustrated in FIG. 1 may support charge binning of multiple light sensor cells, leading to a significant improvement in sensitivity when the image sensor 100 is operated at reduced resolutions. Unlike averaging of the electrical signals generated by the light sensor cells 102, 104, 106, and 108, the electrical signals from the light sensor cells 102, 104, 106, and 108 in binning mode may be combined in the charge domain before read noise factors are introduced to the electrical signals read out from the light sensor cells 102, 104, 106, and 108.

One binning mode may termed same-color binning in that light sensor cells of a single color are combined in the charge domain and then averaged across rows, which may offer increased frame rate and sensitivity albeit with a reduced resolution color image. This is illustrated in FIG. 3 for a 4×4 array of light sensor cells. In the illustrated embodiment, light sensor cells 102, 106, 304, 308, 322, 326, 344, and 348 are green light sensor cells. The light sensor cells 104, 108, 324, and 328 are blue light sensor cells. The light sensor cells 302, 306, 342, and 348 are red light sensor cells.

According to embodiments of the present invention, the green light sensor cells may be binned vertically. For example, green light sensor cells 102 and 106 may be binned vertically, green light sensor cells 304 and 308 may be binned vertically, green light sensor cells 322 and 326 may be binned vertically, and green light sensor cells 344 and 348 may be binned vertically. Similarly, blue light sensor cells 104 and 108 may be binned vertically, and blue light sensor cells 324 and 328 may be binned vertically. Likewise, red light sensor cells 302 and 306 may be binned vertically, and red light sensor cells 342 and 346 may be binned vertically. The result of same color vertical binning according to the embodiment illustrated in FIG. 3 is shown is FIG. 4.

After the light sensor cells of the same color are binned vertically, the results are horizontally digitally averaged to produce an image with a quarter of the resolution of the original 4×4 array. FIG. 5 illustrates the results of digitally averaging the light sensor cells of the same color.

Block 502 in FIG. 5 illustrates that vertically binned red light sensor cells 302 and 306 are averaged with vertically binned red light sensor cells 342 and 346. Block 504 in FIG. 5 illustrates that vertically binned green light sensor cells 344 and 348 are averaged with vertically binned green light sensor cells 304 and 308. Block 506 in FIG. 5 illustrates that vertically binned green light sensor cells 322 and 326 are averaged with vertically binned green light sensor cells 102 and 106. Block 508 in FIG. 5 illustrates that vertically binned blue light sensor cells 324 and 328 are averaged with vertically binned blue light sensor cells 104 and 108. Because the summed charge from two pixels is being measured in a single read operation, the overall signal-to-noise ratio of the resulting image is increased.

For other embodiments, all-color binning may be used. In all-color binning, the charges in all of the light sensor cells within a four-light sensor cell cluster are combined. No-sub-sampling is used. This mode is advantageous because it may provide high frame rates with very high sensitivity and may be used in low-light conditions. The resulting image may be a monochrome image. According to these embodiments, all-color binning may improve signal-to-noise S/N ratio.

Additionally, in embodiments in which sub-sampling is used sub-sampling and auto-focus used at the same time may utilizes fewer resources. The output of the autofocus image and the normal sub-sampling image may be simultaneous, rather than at alternate times. Sub-sampling allows for use of a portion of the image rather than the complete image. Image data that would otherwise be discarded in the sub-sampling mode is used for auto-focus. For example, if the image sensor 100 includes a 100×100 array of light sensor cells, a 50×50 array of light sensor cells may be sampled for use in preview mode and the remaining light sensor cells may be sampled for use in auto-focus mode simultaneously.

FIG. 6 illustrates a first stage of all-color binning using the 4×4 array of light sensor cells depicted in FIG. 3 according to an embodiment of the present invention. Block 602 in FIG. 6 illustrates that the red light sensor cells 342 and 346 are binned vertically with green light sensor cells 344 and 348. Block 604 in FIG. 6 illustrates that the green light sensor cells 322 and 326 are binned vertically with blue light sensor cells 324 and 328. Block 606 in FIG. 6 illustrates that the red light sensor cells 302 and 306 are binned vertically with green light sensor cells 304 and 308. Block 608 in FIG. 6 illustrates that the green light sensor cells 102 and 106 are binned vertically with blue light sensor cells 104 and 108.

After the light sensor cells in FIG. 3 are vertically binned together as indicated in FIG. 6, the results are horizontally digitally averaged to produce a monochromatic image. That is, the binned values are added together and divided by four. FIG. 7 illustrates a monochromatic image resulting from all-color binning according to an embodiment of the present invention.

According to embodiments of the present invention, the improved image information from FIG. 5 and/or the image information from FIG. 7 may be provided to the readout circuitry 120. The readout circuitry 120 passes the improved image information, including luminance levels, to the auto-focus circuitry 124. The improved image information allows the auto-focus circuitry 124 to provide better signals to the lens motor/driver 132 than if the image information were gathered from the light sensor cells 102, 104, 106, and 108 non-simultaneously, such as sequentially, for example. The improved signals provide for finer adjustments to the lens assembly 134. Additionally, the shared pixel structure may be able to add up the signal at the light sensor cells directly, therefore improving the S/N ratio directly.

According to embodiments of the present invention, the improved image information from FIG. 5 and/or the image information from FIG. 7 also may be provided to the readout circuitry 122. The readout circuitry 122 passes the improved image information, including luminance data, color data, light exposure data, chrominance data, etc., to the preview circuitry 126. The display 136 may display a preview of an image in response to signals from the preview circuitry 126. The preview circuitry 126 may use the luminance levels and color levels in the image information to display the preview of the image on the display 136. The improved image information allows the preview circuitry 126 to provide better signals to the display 136 than if the image information were gathered from the light sensor cells 110, 112, 114, and 116 non-simultaneously. The improved signals provide improved S/N ratio at the binning mode. The improved signals also may afford a higher frame rate using the same readout circuitry.

Embodiments of the present invention may be implemented using hardware, software, or a combination thereof. In implementations using software, the software or machine-readable data may be stored on a machine-accessible medium. The machine-readable data may be used to cause a machine, such as, for example, a processor (not shown) to perform the method and processes herein. A machine-readable medium includes any mechanism that may be adapted to store and/or transmit information in a form accessible by a machine (e.g., a computer, network device, personal digital assistant, manufacturing tool, any device with a set of one or more processors, etc.). For example, a machine-readable medium includes recordable and non-recordable media (e.g., read only (ROM), random access (RAM), magnetic disk storage media, optical storage media, flash devices, etc.).

The terms used in the following claims should not be construed to limit embodiments of the invention to the specific embodiments disclosed in the specification and the claims. Rather, the scope of embodiments of the invention is to be determined entirely by the following claims, which are to be construed in accordance with established doctrines of claim interpretation.

What is claimed is:

1. An apparatus, comprising:
   a plurality of light sensor cells disposed in a substrate;
   first common readout circuitry coupled to at least two light sensor cells in the plurality of light sensor cells, wherein the first common readout circuitry is to read out image information from the at least two light sensor cells simultaneously;
   auto-focus circuitry coupled to the first common readout circuitry to receive the simultaneously read out image information;
   second common readout circuitry coupled to a second at least two light sensor cells in the plurality of light sensor cells, wherein the second common readout circuitry is to read out image information from the second at least two light sensor cells simultaneously; and
   preview circuitry coupled to the second common readout circuitry to cause an image to be displayed using the simultaneously read out image information in the second at least two light sensor cells,
   wherein the auto focus circuitry and the preview circuitry are configured to simultaneously read out image information.

2. The apparatus of claim 1, wherein an individual light sensor cell comprises:
   a photosensitive element;
   a floating diffusion region; and
   a transfer transistor, wherein the transfer transistors for the respective light sensor cells are to couple the respective photosensitive element to the respective floating diffusion region simultaneously.

3. The apparatus of claim 1, wherein the at least two light sensor cells are of a same color.

4. The apparatus of claim 1, wherein the at least two light sensor cells are of a different color.

5. The apparatus of claim 1, wherein the image information comprises luminance levels.

6. The apparatus of claim 2, wherein the common readout circuitry comprises a reset gate having a source coupled to each of the floating diffusion regions.

7. The apparatus of claim 6, wherein the reset gate comprises a drain coupled to a reference voltage, where if the reset gate is on, the at least two light sensor cells are coupled to the reference voltage.

8. The apparatus of claim 6, wherein the common readout circuitry further comprises a source follower having a gate coupled to the source of the reset gate.

9. The apparatus of claim 8, wherein the common readout circuitry further comprises a row select gate having a source coupled to a source of the source follower and a drain coupled to a column bit line.

10. The apparatus of claim 9, wherein the common readout circuitry further comprises a sense amplifier having an input coupled to the column bit line and the source of the source follower, wherein the sense amplifier comprises an output coupled to the auto-focus circuitry.

11. An apparatus, comprising:
    a plurality of light sensor cells disposed in a substrate;
    first common readout circuitry coupled to a first group of light sensor cells in the plurality of light sensor cells, wherein the first common readout circuitry is to read out image information from the first group of light sensor cells simultaneously;
    auto-focus circuitry coupled to the first common readout circuitry to receive the simultaneously read out image information;
    automatic gain control circuitry coupled to control an amplitude of the simultaneously read out image information coupled to the auto-focus circuitry;
    second common readout circuitry coupled to a second at least two light sensor cells in the plurality of light sensor cells, wherein the second common readout circuitry is to read out image information from the second at least two light sensor cells simultaneously; and
    preview circuitry coupled to the second common readout circuitry to cause an image to be displayed using the simultaneously read out image information in the second group of light sensor cells,
    wherein the auto focus circuitry and the preview circuitry are configured to simultaneously read out image information.

12. The apparatus of claim 11, further comprising first automatic exposure control circuitry coupled to control an exposure of the first group of light sensor cells to light.

13. The apparatus of claim 12, further comprising second automatic exposure control circuitry coupled to control an exposure of the second group of light sensor cells to light.

14. A method, comprising:
- accumulating image information in at least two light sensor cells in a plurality of light sensor cells in response to being exposed to light;
- reading out the image information accumulated in the at least two light sensor cells simultaneously;
- adjusting a focus of an optical system using the simultaneously read out accumulated image information;
- accumulating image information in a second at least two light sensor cells in the plurality of light sensor cells in response to being exposed to light; reading out the image information accumulated in the at least two light sensor cells simultaneously;
- displaying an image in preview circuitry of the optical system using the simultaneously read out image information accumulated in the second at least two light sensor cells; and
- simultaneously adjusting the focus of the optical system and displaying the image in the preview circuitry of the optical system,
- wherein the auto focus circuitry and the preview circuitry are configured to simultaneously read out image information.

15. The method of claim 14, wherein an individual light sensor cell comprises a photosensitive element and a floating diffusion region, and wherein resetting the at least two light sensor cells further comprises applying a reference voltage level to the respective photosensitive elements and the respective floating diffusion regions.

16. The method of claim 14, wherein reading out the image information accumulated in the at least two light sensor cells simultaneously comprises adding together the image information accumulated in the at least two light sensor cells.

17. The method of claim 15, wherein an individual light sensor cell further comprises a transfer transistor and common readout circuitry coupled to the at least two light sensor cells comprises a reset gate, and wherein resetting the at least two light sensor cells further comprises turning on their respective transfer transistors and the reset gate simultaneously.

18. The method of claim 17, wherein accumulating image information in the at least two light sensor cells in response to being exposed to light comprises turning off the respective transfer transistors.

19. The method of claim 16, wherein adjusting the focus of the optical system using the simultaneously read out accumulated image information reading out the image information accumulated in the at least two light sensor cells simultaneously comprises:
- transferring to autofocus circuitry in the optical system the added together accumulated image information; and
- extracting luminance values from the added together accumulated image information.

20. The method of claim 16, wherein the at least two light sensor cells are of a same color.

21. The method of claim 16, wherein the at least two light sensor cells are of a different color.

* * * * *